(12) United States Patent
Bozdag et al.

(10) Patent No.: US 12,424,293 B2
(45) Date of Patent: Sep. 23, 2025

(54) ONE-TIME PROGRAMMABLE MEMORY DEVICES AND METHODS

(71) Applicant: Sandisk Technologies, Inc., Milpitas, CA (US)

(72) Inventors: Deniz Bozdag, Sunnyvale, CA (US); Juan P. Saenz, Menlo Park, CA (US); Dimitri Houssameddine, Sunnyvale, CA (US); Mark Lin, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 138 days.

(21) Appl. No.: 18/355,357

(22) Filed: Jul. 19, 2023

(65) Prior Publication Data

US 2024/0321371 A1    Sep. 26, 2024

Related U.S. Application Data

(60) Provisional application No. 63/491,766, filed on Mar. 23, 2023.

(51) Int. Cl.
*G11C 17/00* (2006.01)
*G11C 17/16* (2006.01)
(Continued)

(52) U.S. Cl.
CPC ............ *G11C 17/165* (2013.01); *G11C 17/18* (2013.01); *H10B 20/25* (2023.02)

(58) Field of Classification Search
CPC . G11C 13/004; G11C 11/1675; G11C 17/165; G11C 17/16; G11C 11/1659; G11C 13/0069; G11C 13/0004; G11C 13/003; G11C 11/1673; G11C 13/0007; G11C 2213/72; G11C 13/0002; G11C 13/0028; G11C 17/18; G11C 2213/74; G11C 11/161; G11C 13/0011; G11C 2013/0073; G11C 8/14; G11C 13/0026; G11C 11/1697; G11C 13/0061; G11C 2013/0054; G11C 11/1655; G11C 11/56; G11C 2213/15; G11C 2213/71; G11C 27/02; G11C 27/024;
(Continued)

(56) References Cited

U.S. PATENT DOCUMENTS 6,324,093 B1    11/2001   Perner et al.
7,486,537 B2    2/2009    Scheuerlein et al.
(Continued)

OTHER PUBLICATIONS

U.S. Appl. No. 18/355,359, filed Jul. 19, 2023.

*Primary Examiner* — Thong Q Le
(74) *Attorney, Agent, or Firm* — PEARL COHEN ZEDEK LATZER BARATZ LLP

(57) ABSTRACT

An apparatus is provided that includes a memory cell having a reversible resistance-switching memory element coupled in series with a selector element. The selector element has a first resistance. The resistance-switching memory element is configured to reversibly switch between a second resistance and a third resistance. The memory cell may be selectively configured as either a re-writeable memory cell or a one-time programmable memory cell. The memory cell functions as a one-time programmable memory cell regardless of whether the resistance-switching memory element has the second resistance, the third resistance, or is electrically shorted.

19 Claims, 13 Drawing Sheets

(51) Int. Cl.
  *G11C 17/18* (2006.01)
  *H10B 20/25* (2023.01)
(58) Field of Classification Search
  CPC ......... G11C 5/06; G11C 5/063; G11C 11/005;
      G11C 11/1653; G11C 11/2273; G11C
      13/0038; G11C 16/0408; G11C 16/28;
      G11C 17/00; G11C 17/02; G11C 17/06;
      G11C 2213/79; G11C 29/42; G11C
      29/52; G11C 7/04; G11C 7/12; G11C
      7/20; G11C 8/08; H10B 63/20; H10B
      61/10; H10B 63/30; H10B 61/00; H10B
      61/22; H10B 20/25; H10B 63/80
  See application file for complete search history.

(56) References Cited

U.S. PATENT DOCUMENTS

| | | |
|---|---|---|
| 9,019,742 B2 | 4/2015 | Chung |
| 9,165,631 B2 | 10/2015 | Kim et al. |
| 9,793,003 B2 | 10/2017 | Abedifard et al. |
| 9,805,816 B2 | 10/2017 | Jan et al. |
| 10,102,896 B2 | 10/2018 | Jan et al. |
| 10,121,540 B1 | 11/2018 | Jo |
| 10,217,521 B2 | 2/2019 | Omid-Zohoor et al. |
| 10,839,929 B2 | 11/2020 | Jung et al. |
| 11,062,786 B2 * | 7/2021 | Chung ................... G11C 17/16 |
| 2010/0091546 A1 | 4/2010 | Liu et al. |
| 2020/0194048 A1 | 6/2020 | Roy et al. |

* cited by examiner

ONE-TIME PROGRAMMABLE MEMORY DEVICES AND METHODS

CLAIM OF PRIORITY

The present application claims priority from U.S. Provisional Patent Application No. 63/491,766, entitled "ONE-TIME PROGRAMMABLE MEMORY DEVICES AND METHODS," filed Mar. 23, 2023, which is incorporated by reference herein in its entirety.

BACKGROUND

Memory is widely used in various electronic devices such as cellular telephones, digital cameras, personal digital assistants, medical electronics, mobile computing devices, non-mobile computing devices and data servers. Memory may be non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that store data using electronic charge. Generally, MRAM includes a large number of magnetic memory cells formed on a semiconductor substrate, where each memory cell represents one bit of data. A bit of data is written to a memory cell by changing the direction of magnetization of a magnetic element within the memory cell, and a bit is read by measuring the resistance of the memory cell (low resistance typically represents a "0" bit, and high resistance typically represents a "1" bit). As used herein, direction of magnetization is the direction of orientation of the magnetic moment. Some memory cells may include a selector device, such as an ovonic threshold switch or other selector device.

Although MRAM is a promising technology, numerous design and process challenges remain.

DETAILED DESCRIPTION

Technology is described for providing memory cells that may be used as either one-time programmable memory cells or re-writeable memory cells. The memory cells have a same structure and are fabricated using a same fabrication process using same materials and same processing steps. The memory cells may be formed as a single memory array of memory cells, or may be formed as separate arrays of one-time programmable memory cells and re-writeable memory cells.

In embodiment, the memory cells include a memory element coupled in series with a selector device. In an embodiment, the memory element is a magnetic memory element. In an embodiment, the memory element is a magnetic tunnel junction memory element. In an embodiment, the selector device is an ovonic threshold switch. In an embodiment, the memory cells may be used as one-time programmable memory cells having a data state that is independent of the data state of the memory element.

In an embodiment, memory cells within a memory array may include non-volatile memory cells including a reversible resistance-switching element. A reversible resistance-switching element may include a reversible resistivity-switching material having a resistivity that may be reversibly switched between two or more states.

In an embodiment, the reversible resistance-switching material may include a metal oxide, solid electrolyte, phase-change material, magnetic material, or other similar resistivity-switching material. Various metal oxides can be used, such as transition metal-oxides. Examples of metal-oxides include, but are not limited to, NiO, $Nb_2O_5$, $TiO_2$, $HfO_2$, $Al_2O_3$, MgOx, $CrO_2$, VO, BN, $TaO_2$, $Ta_2O_3$, and AlN.

In an embodiment, non-volatile memory cells within a memory array include one-time programmable memory cells. In an embodiment, non-volatile memory cells within a memory array include re-writeable memory cells. In an embodiment, non-volatile memory cells within a memory array include memory cells that may be configured as one-time programmable memory cells or re-writeable memory cells. In an embodiment, non-volatile memory cells within a memory array include memory cells that have a same structure and may be configured as one-time programmable memory cells or re-writeable memory cells. In an embodiment, non-volatile memory cells within a memory array include memory cells fabricated using a same fabrication process and may be configured as one-time programmable memory cells or re-writeable memory cells.

Figure 1A:
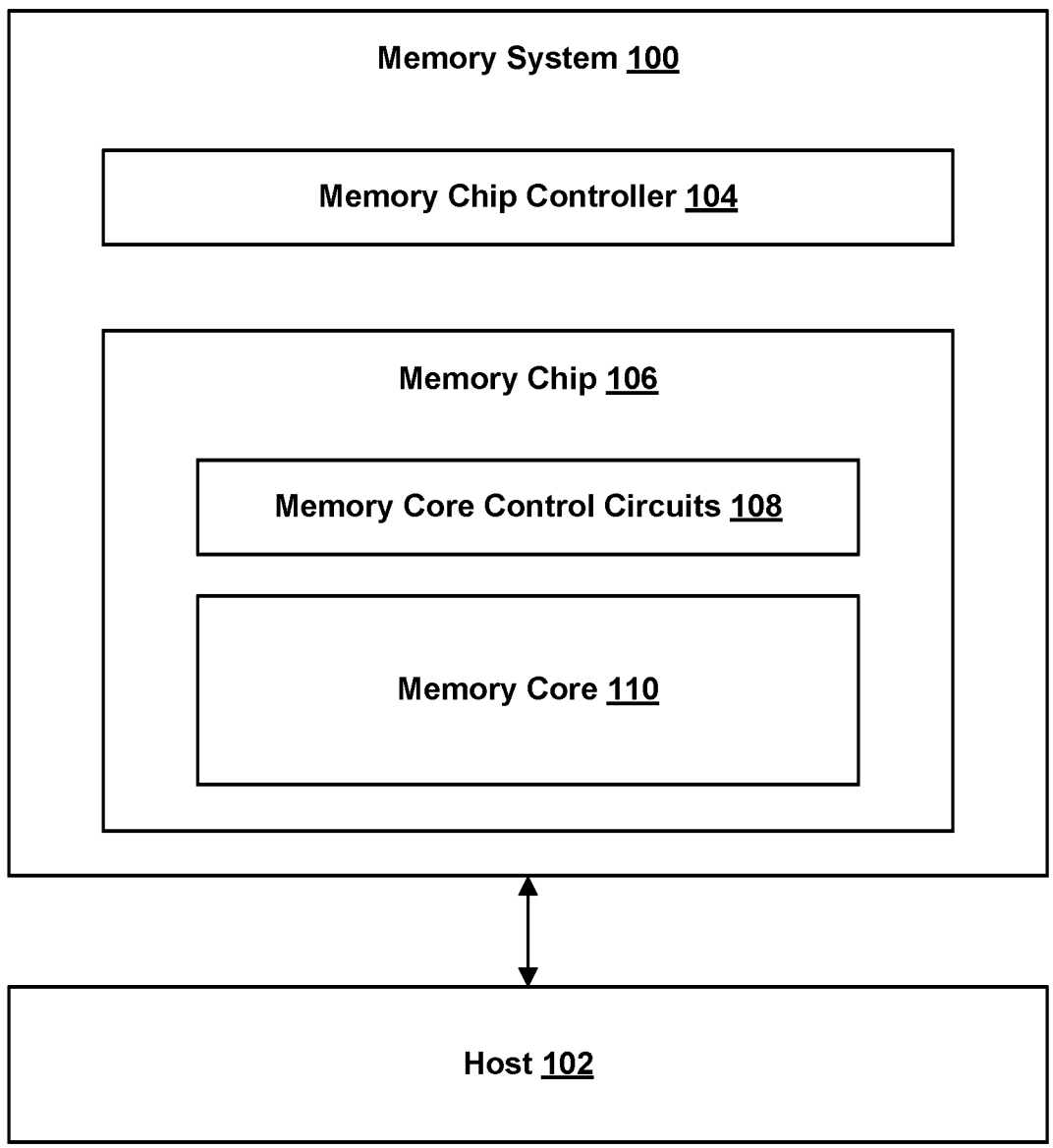
FIGS. 1A-1H depict various embodiments of a memory system.

FIG. 1A depicts one embodiment of a memory system 100 and a host 102. Memory system 100 may include a non-volatile storage system interfacing with host 102 (e.g., a mobile computing device or a server). In some cases, memory system 100 may be embedded within host 102. As examples, memory system 100 may be a memory card, a solid-state drive (SSD) such a high density MLC SSD (e.g., 2-bits/cell or 3-bits/cell) or a high performance SLC SSD, or a hybrid HDD/SSD drive.

As depicted, memory system 100 includes a memory chip controller 104 and a memory chip 106. Memory chip 106 may include volatile memory and/or non-volatile memory. Although a single memory chip is depicted, memory system 100 may include more than one memory chip. Memory chip controller 104 may receive data and commands from host 102 and provide memory chip data to host 102.

Memory chip controller 104 may include one or more of control circuitry, state machines, page registers, SRAM, decoders, sense amplifiers, read/write circuits, and/or controllers, or any combination thereof, for controlling the operation of memory chip 106. The one or more control circuitry, state machines, page registers, SRAM, decoders, sense amplifiers, read/write circuits, and/or controllers for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit or arranged on a single die. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells and/or one or more three-dimensional arrays of memory cells. In an embodiment, memory core may include re-writable memory cells, one-time programmable memory cells, and/or multi-time programmable memory cells, or any combination thereof.

In an embodiment, memory core control circuits 108 and memory core 110 may be arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 may send to memory chip controller 104 both a write command and the data to be written.

Memory chip controller 104 may buffer data to be written and may generate error correction code (ECC) data corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 may control operation of memory chip 106. In an example, before issuing a write operation to memory chip 106, memory chip controller 104 may check a status register to make sure that memory chip 106 is able to accept the data to be written.

In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested.

Once memory chip controller 104 initiates a read or write operation, memory core control circuits 108 may generate appropriate bias voltages for word lines and bit lines within memory core 110, as well as generate the appropriate memory block, row, and column addresses.

Figure 1B:
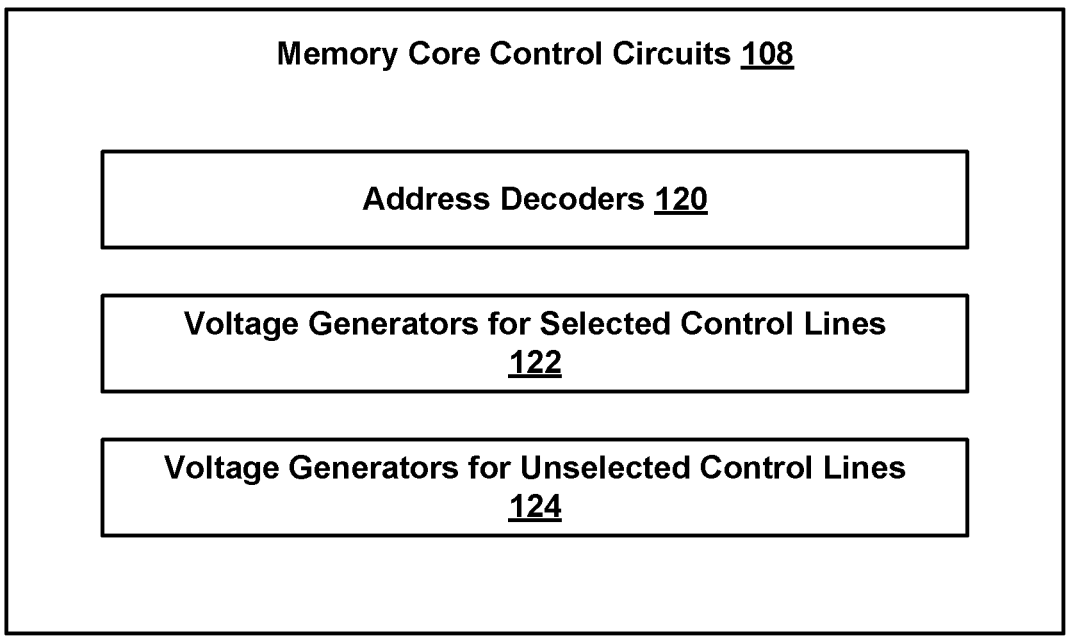

FIG. 1B depicts an embodiment of memory core control circuits 108. In an embodiment, memory core control circuits 108 include address decoders 120, voltage generators for selected control lines 122, and voltage generators for unselected control lines 124. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state.

Voltage generators (or voltage regulators) for selected control lines 122 may include one or more voltage generators for generating selected control line voltages. Voltage generators for unselected control lines 124 may include one or more voltage generators for generating unselected control line voltages. Address decoders 120 may generate memory block addresses, as well as row addresses and column addresses for a particular memory block.

FIGS. 1C-1F depict one embodiment of a memory core organization that includes a memory core 110 having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
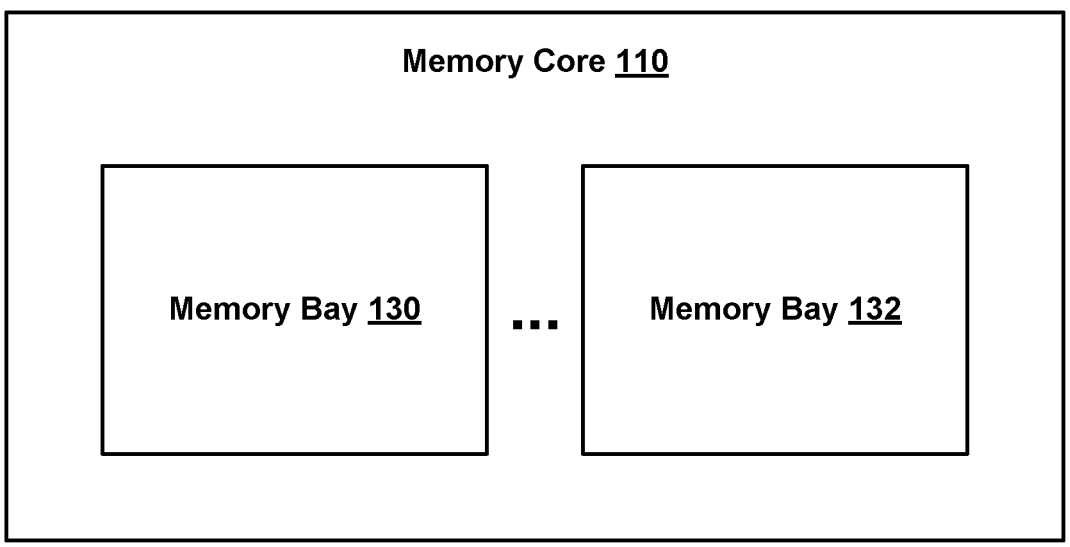

FIG. 1C depicts an embodiment of memory core 110 of FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 memory bays, 256 memory bays, etc.).

Figure 1D:
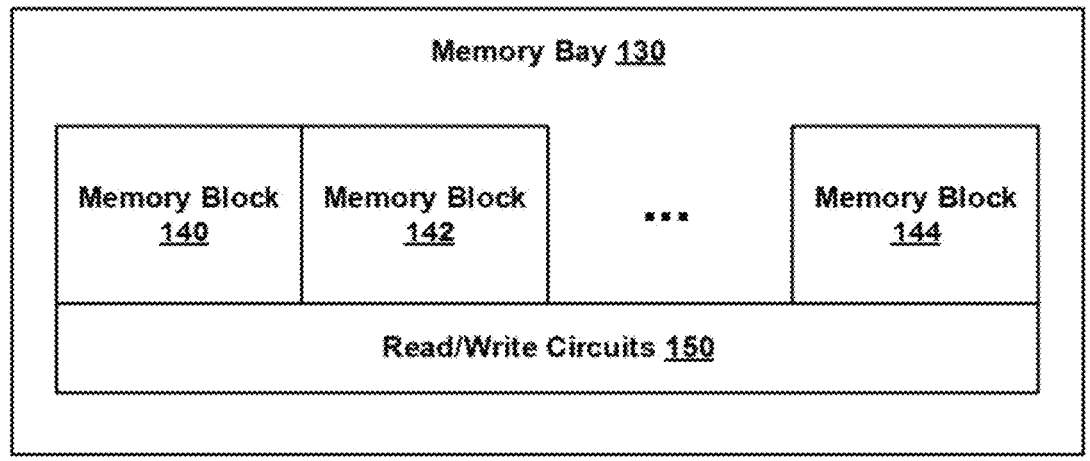

FIG. 1D depicts one embodiment of memory bay 130 of FIG. 1C. As depicted, memory bay 130 includes memory blocks 140-144 and read/write circuits 150. In some embodiments, the number of memory blocks per memory bay may be different for different implementations. For example, a memory bay may include one or more memory blocks (e.g., 32 memory blocks per memory bay).

Read/write circuits 150 include circuitry for reading and writing memory cells within memory blocks 140-144. As depicted, read/write circuits 150 may be shared across multiple memory blocks within a memory bay. This allows chip area to be reduced because a single group of read/write circuits 150 may be used to support multiple memory blocks. However, in some embodiments, only a single memory block may be electrically coupled to read/write circuits 150 at a particular time to avoid signal conflicts.

In some embodiments, read/write circuits 150 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In an example, memory system 100 of FIG. 1A may receive a write command including a target address and a set of data to be written to the target address. Memory system 100 may perform a read-before-write (RBW) operation to read the data currently stored at the target address before performing a write operation to write the set of data to the target address. Memory system 100 may then determine whether a particular memory cell may stay at its current state (i.e., the memory cell is already at the correct state), needs to be set to a "0" state, or needs to be reset to a "1" state.

Memory system 100 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells.

A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 150 may be used to program a particular memory cell to be in one of three or more data/resistance states (i.e., the particular memory cell may comprise a multi-level memory cell). In an example, read/write circuits 150 may apply a first voltage difference (e.g., 2V) across the particular memory cell to program the particular memory cell to a first state of the three or more data/resistance states, or a second voltage difference (e.g., 1V) across the particular memory cell that is less than the first voltage difference to program the particular memory cell to a second state of the three or more data/resistance states.

Applying a smaller voltage difference across the particular memory cell may cause the particular memory cell to be partially programmed or programmed at a slower rate than when applying a larger voltage difference. In another example, read/write circuits 150 may apply a first voltage difference across the particular memory cell for a first time period (e.g., 150 ns) to program the particular memory cell to a first state of the three or more data/resistance states, or apply the first voltage difference across the particular memory cell for a second time period less than the first time period (e.g., 50 ns). One or more programming pulses followed by a memory cell verification phase may be used to program the particular memory cell to be in the correct state.

Figure 1E:
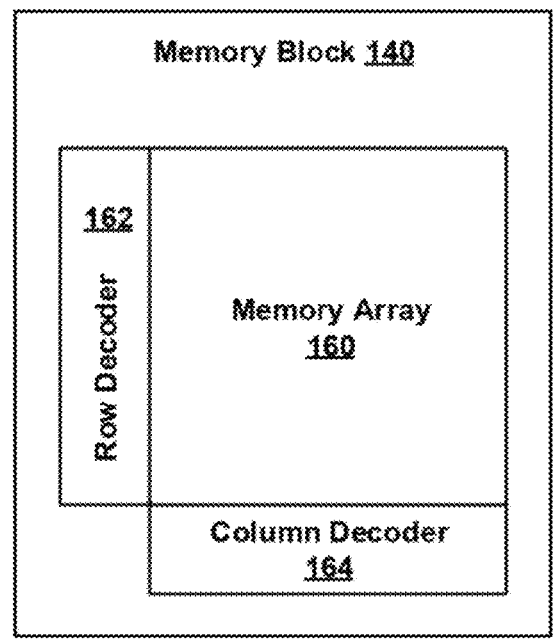

FIG. 1E depicts one embodiment of memory block 140 of FIG. 1D. As depicted, memory block 140 includes a memory array 160, a row decoder 162, and a column decoder 164. Memory array 160 may include a contiguous group of memory cells having contiguous word lines and bit lines. Memory array 160 may include one or more layers of memory cells, and may include a two-dimensional memory array and/or a three-dimensional memory array.

Row decoder 162 decodes a row address and selects a particular word line in memory array 160 when appropriate (e.g., when reading or writing memory cells in memory array 160). Column decoder 164 decodes a column address and selects a particular group of bit lines in memory array 160 to be electrically coupled to read/write circuits, such as read/write circuits 150 of FIG. 1D. In an embodiment, the number of word lines is 4K per memory layer, the number of bit lines is 1K per memory layer, and the number of memory layers is 4, providing a memory array 160 containing 16M memory cells. Other numbers of word lines per layer, bit lines per layer, and number of layers may be used.

Figure 1F:
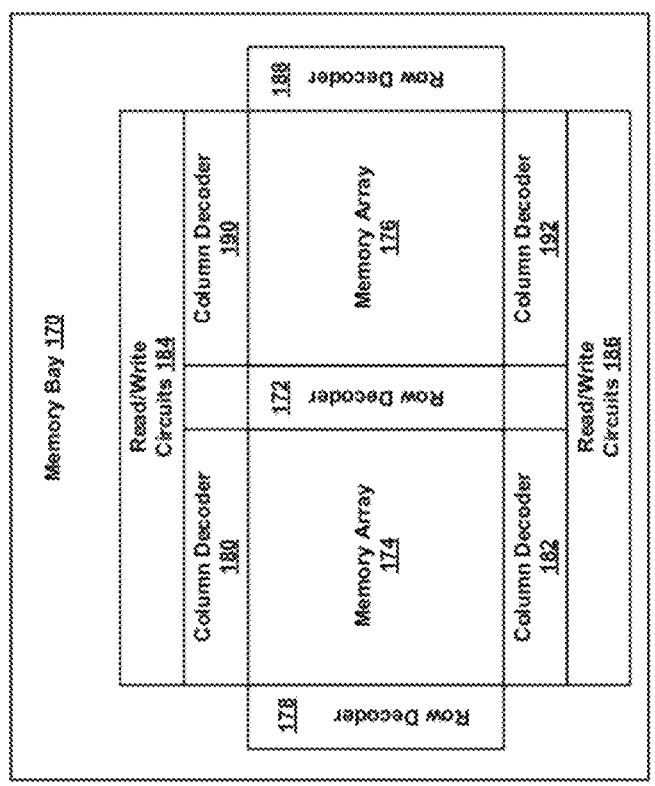

FIG. 1F depicts an embodiment of a memory bay 170. Memory bay 170 is an example of an alternative implementation for memory bay 130 of FIG. 1D. In some embodiments, row decoders, column decoders, and read/write circuits may be split or shared between memory arrays. As depicted, row decoder 172 is shared between memory arrays 174 and 176, because row decoder 172 controls word lines in both memory arrays 174 and 176 (i.e., the word lines driven by row decoder 172 are shared).

Row decoders 178 and 172 may be split such that even word lines in memory array 174 are driven by row decoder 178 and odd word lines in memory array 174 are driven by row decoder 172. Column decoders 180 and 182 may be split such that even bit lines in memory array 174 are controlled by column decoder 182 and odd bit lines in memory array 174 are driven by column decoder 180.

The selected bit lines controlled by column decoder 180 may be electrically coupled to read/write circuits 184. The selected bit lines controlled by column decoder 182 may be electrically coupled to read/write circuits 186. Splitting the read/write circuits into read/write circuits 184 and 186 when the column decoders are split may allow for a more efficient layout of the memory bay.

Row decoders 188 and 172 may be split such that even word lines in memory array 176 are driven by row decoder 188 and odd word lines in memory array 176 are driven by row decoder 172. Column decoders 190 and 192 may be split such that even bit lines in memory array 176 are controlled by column decoder 192 and odd bit lines in memory array 176 are driven by column decoder 190.

The selected bit lines controlled by column decoder 190 may be electrically coupled to read/write circuits 184. The selected bit lines controlled by column decoder 192 may be electrically coupled to read/write circuits 186. Splitting the read/write circuits into read/write circuits 184 and 186 when the column decoders are split may allow for a more efficient layout of the memory bay.

Figure 1G:
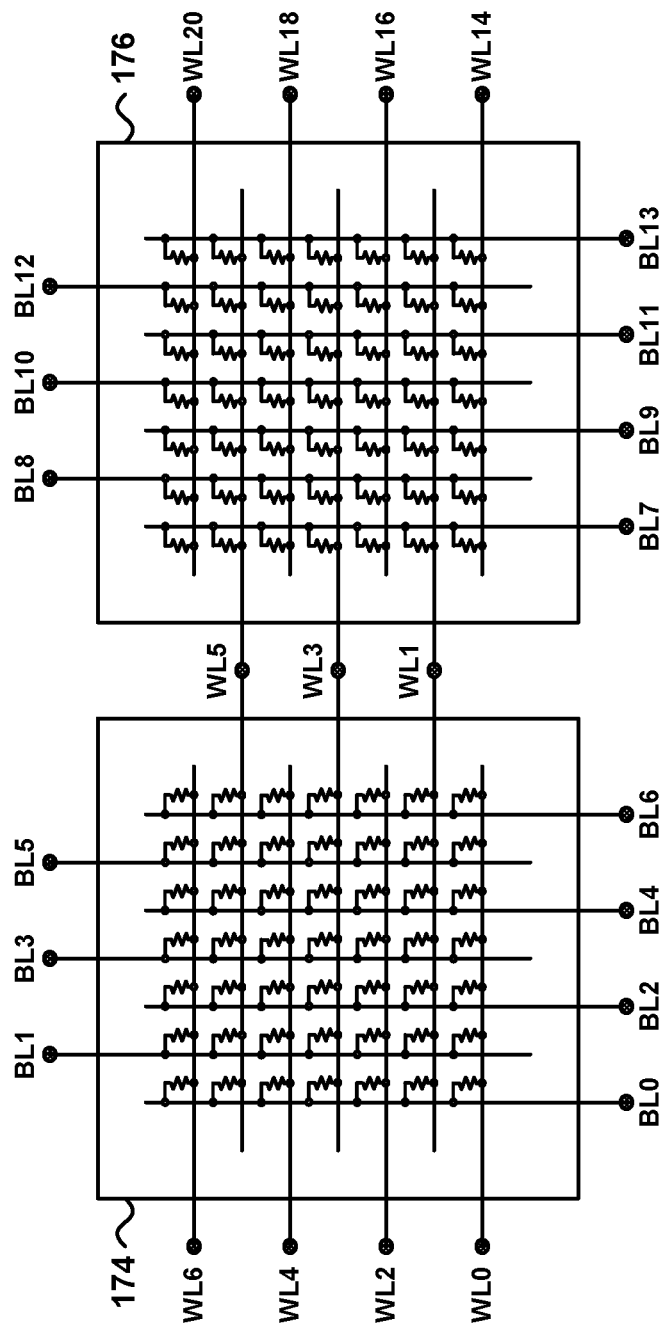

FIG. 1G depicts an embodiment of a schematic diagram (including word lines and bit lines) corresponding with memory bay 170 in FIG. 1F. As depicted, word lines WL1, WL3, and WL5 are shared between memory arrays 174 and 176 and controlled by row decoder 172 of FIG. 1F. Word lines WL0, WL2, WL4, and WL6 are driven from the left side of memory array 174 and controlled by row decoder 178 of FIG. 1F. Word lines WL14, WL16, WL18, and WL20 are driven from the right side of memory array 176 and controlled by row decoder 188 of FIG. 1F.

Bit lines BL0, BL2, BL4, and BL6 are driven from the bottom of memory array 174 and controlled by column decoder 182 of FIG. 1F. Bit lines BL1, BL3, and BL5 are driven from the top of memory array 174 and controlled by column decoder 180 of FIG. 1F. Bit lines BL7, BL9, BL11, and BL13 are driven from the bottom of memory array 176 and controlled by column decoder 192 of FIG. 1F. Bit lines BL8, BL10, and BL12 are driven from the top of memory array 176 and controlled by column decoder 190 of FIG. 1F.

In an embodiment, memory arrays 174 and 176 may include memory layers that are oriented in a plane that is horizontal to the supporting substrate. In another embodiment, memory arrays 174 and 176 may include memory layers that are oriented in a plane that is vertical with respect to the supporting substrate (i.e., the vertical plane is substantially perpendicular to the supporting substrate). In this case, the bit lines of the memory arrays may include substantially vertical bit lines.

Figure 1H:
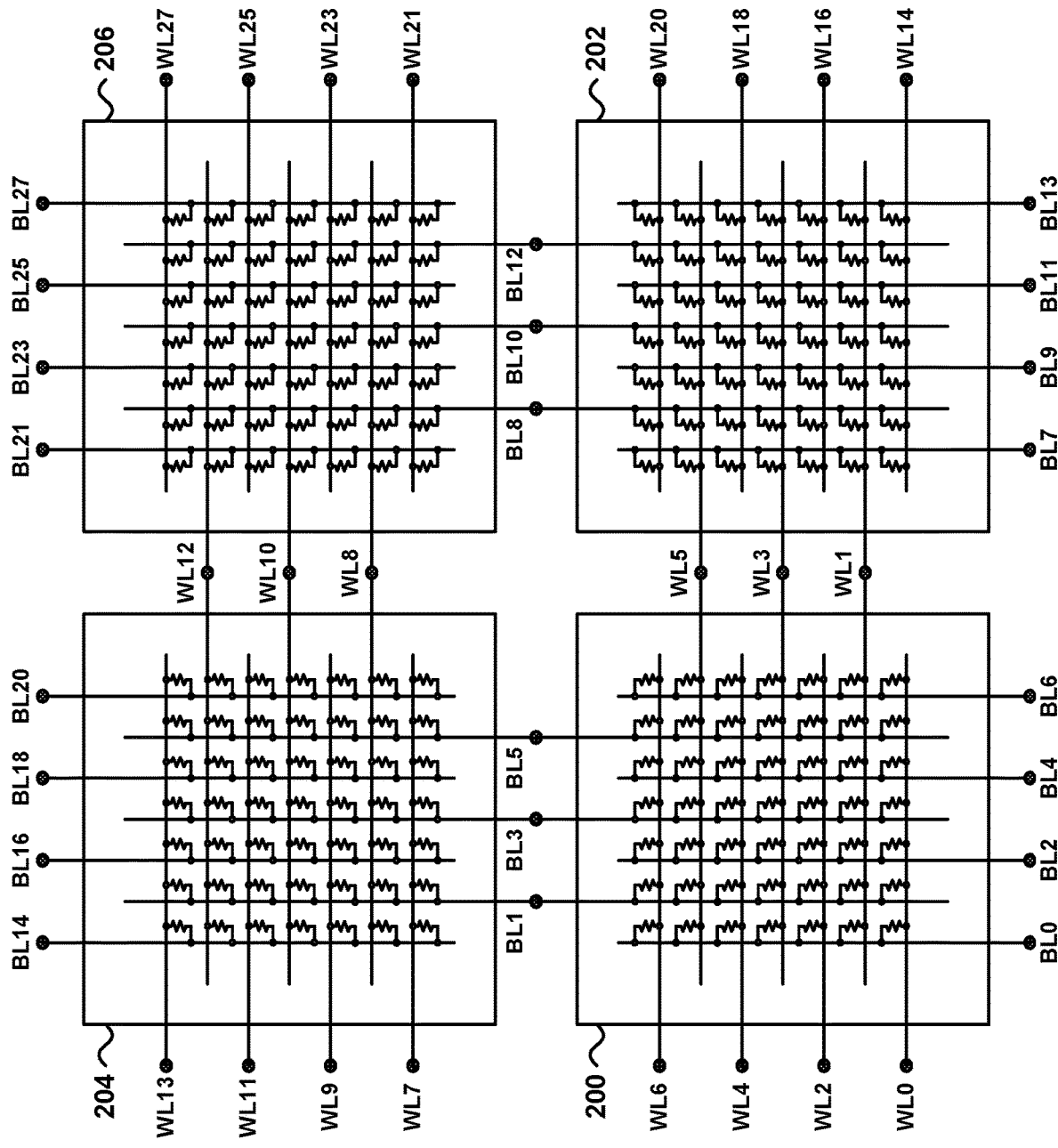

FIG. 1H depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area because a single row decoder and/or column decoder can be used to support two memory arrays.

As depicted, word lines WL1, WL3, and WL5 are shared between memory arrays 200 and 202. Bit lines BL1, BL3, and BL5 are shared between memory arrays 200 and 204. Word lines WL8, WL10, and WL12 are shared between memory arrays 204 and 206. Bit lines BL8, BL10, and BL12 are shared between memory arrays 202 and 206.

Row decoders are split such that word lines WL0, WL2, WL4, and WL6 are driven from the left side of memory array 200 and word lines WL1, WL3, and WL5 are driven from the right side of memory array 200. Likewise, word lines WL7, WL9, WL11, and WL13 are driven from the left side of memory array 204 and word lines WL8, WL10, and WL12 are driven from the right side of memory array 204.

Column decoders are split such that bit lines BL0, BL2, BL4, and BL6 are driven from the bottom of memory array 200 and bit lines BL1, BL3, and BL5 are driven from the top of memory array 200. Likewise, bit lines BL7, BL9, BL11, and BL13 are driven from the bottom of memory array 202 and bit lines BL8, BL10, and BL12 are driven from the top of memory array 202. Splitting row and/or column decoders also helps to relieve layout constraints (e.g., the column decoder pitch can be relieved by 2× since the split column decoders need only drive every other bit line instead of every bit line).

Figure 2A:
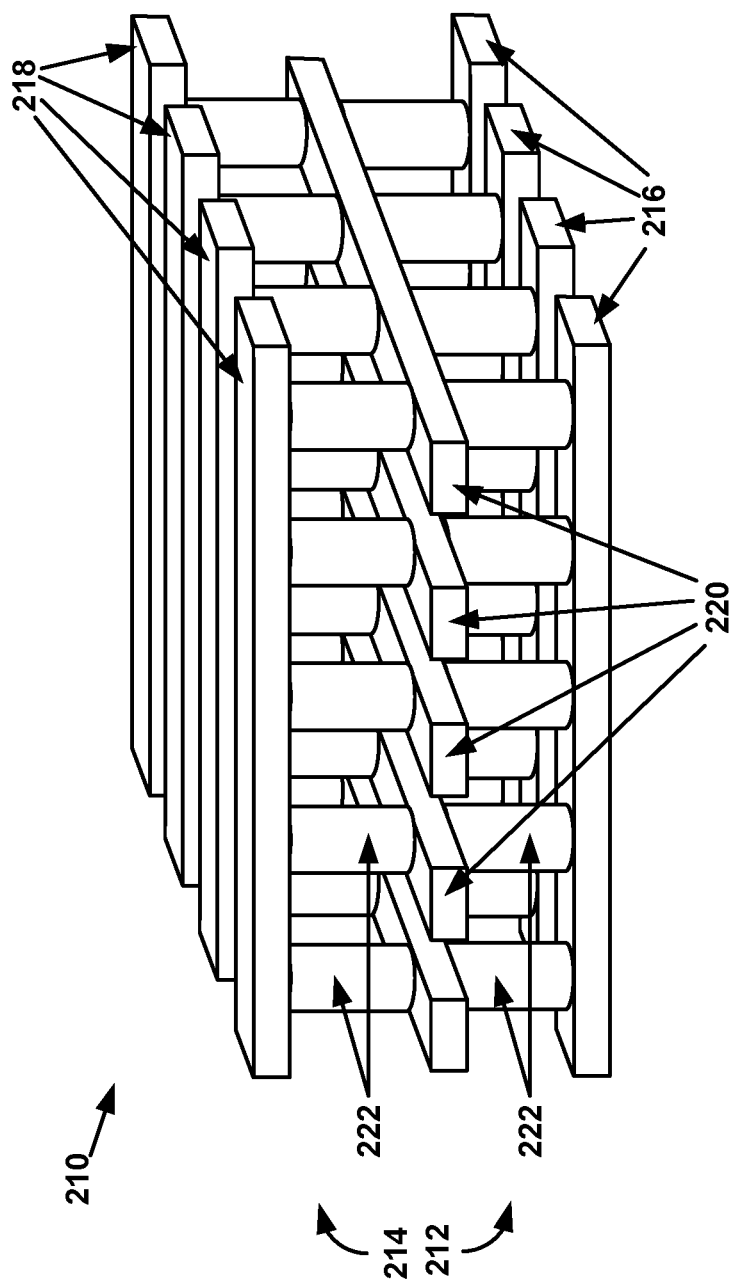
FIG. 2A depicts an embodiment of a portion of a three-dimensional memory array.

FIG. 2A depicts an embodiment of a portion of a monolithic three-dimensional memory array 210 that includes a first memory level 212, and a second memory level 214 positioned above first memory level 212. Memory array 210 is an example of an implementation of memory array 160 in FIG. 1E. Word lines 216 and 218 are arranged in a first direction and bit lines 220 are arranged in a second direction perpendicular to the first direction. As depicted, the upper conductors of first memory level 212 may be used as the lower conductors of second memory level 214. In a memory array with additional layers of memory cells, there would be corresponding additional layers of bit lines and word lines.

Memory array 210 includes a plurality of memory cells 222. In embodiments, memory cells 222 may include re-writeable memory cells, one-time programmable memory cells, and multi-time programmable memory cells. In an embodiment, each of memory cells 222 are vertically-oriented. Memory cells 222 may include non-volatile memory cells or volatile memory cells. With respect to first memory level 212, a first portion of memory cells 222 are between and connect to word lines 216 and bit lines 220. With respect to second memory level 214, a second portion of memory cells 222 are between and connect to word lines 218 and bit lines 220.

In an embodiment, each memory cell 222 includes a selector element coupled in series with a resistance-switching memory element, where each memory cell 222 represents one bit of data. In an embodiment, the resistance-switching memory element may be a magnetic memory element, a ReRAM memory element, a phase change memory element or other type of resistance-switching memory element.

In an embodiment, each memory cell 222 includes a selector element coupled in series with a magnetic memory element, where each memory cell 222 represents one bit of data. FIG. 2B is a simplified schematic diagram of a memory cell 222a, which is one example implementation of memory cells 222 of FIG. 2A.

In an embodiment, memory cell 222a includes a magnetic memory element $M_x$ coupled in series with a selector element $S_x$, both coupled between a first terminal T1 and a second terminal T2. In an embodiment, memory cell 222a is vertically-oriented. In the embodiment of FIG. 2B, magnetic memory element $M_x$ is disposed above selector element $S_x$. In other embodiments, selector element $S_x$ may be disposed above magnetic memory element $M_x$.

In an embodiment, magnetic memory element $M_x$ is a magnetic tunnel junction, and selector element $S_x$ is a threshold selector device. In an embodiment, selector element $S_x$ is a conductive bridge threshold selector device. In other embodiments, selector element $S_x$ is an ovonic threshold switch (e.g., binary SiTe, CTe, BTe, AlTe, etc., or the ternary type AsTeSi, AsTeGe or AsTeGeSiN, etc.), a Metal Insulator Transition (MIT) of a Phase Transition Material type (e.g., $VO_2$, $NbO_2$ etc.), or other similar threshold selector device.

In an embodiment, magnetic memory element $M_x$ includes an upper ferromagnetic layer 230, a lower ferromagnetic layer 232, and a tunnel barrier (TB) 234 which is an insulating layer between the two ferromagnetic layers. In this example, lower ferromagnetic layer 232 is a free layer (FL) that has a direction of magnetization that can be switched. Upper ferromagnetic layer 230 is the pinned (or fixed) layer (PL) that has a direction of magnetization that is not easily changed.

In other embodiments, magnetic memory element $M_x$ may include fewer, additional, or different layers than those depicted in FIG. 2B. In other embodiments, lower ferromagnetic layer 232 is a pinned layer (PL) and upper ferromagnetic layer 230 is the free layer (FL).

When the direction of magnetization in free layer 232 is parallel to that of pinned layer 230, memory element $M_x$ has a relatively low resistance RP (referred to herein as "parallel resistance RP"). When the direction of magnetization in free layer 232 is anti-parallel to that of pinned layer 230, memory element $M_x$ has a relatively high resistance RAP (referred to herein as "anti-parallel resistance RAP").

In an embodiment, the data state ("0" or "1") of magnetic memory element $M_x$ is read by measuring the resistance of magnetic memory element $M_x$. By design, both the parallel and anti-parallel configurations remain stable in the quiescent state and/or during a read operation (at sufficiently low read current).

In an embodiment, selector element $S_x$ is an ovonic threshold switch that includes a first region 236 and optionally includes a second region 238 disposed above first region 236. In an embodiment, first region 236 is a SiTe alloy, and optional second region 238 is carbon nitride. Other materials may be used for first region 236 and optional second region 238. In other embodiments, selector element $S_x$ is a conductive bridge threshold selector element. In an embodiment, first region 236 is a solid electrolyte region, and second region 238 is an ion source region.

Figure 2C:
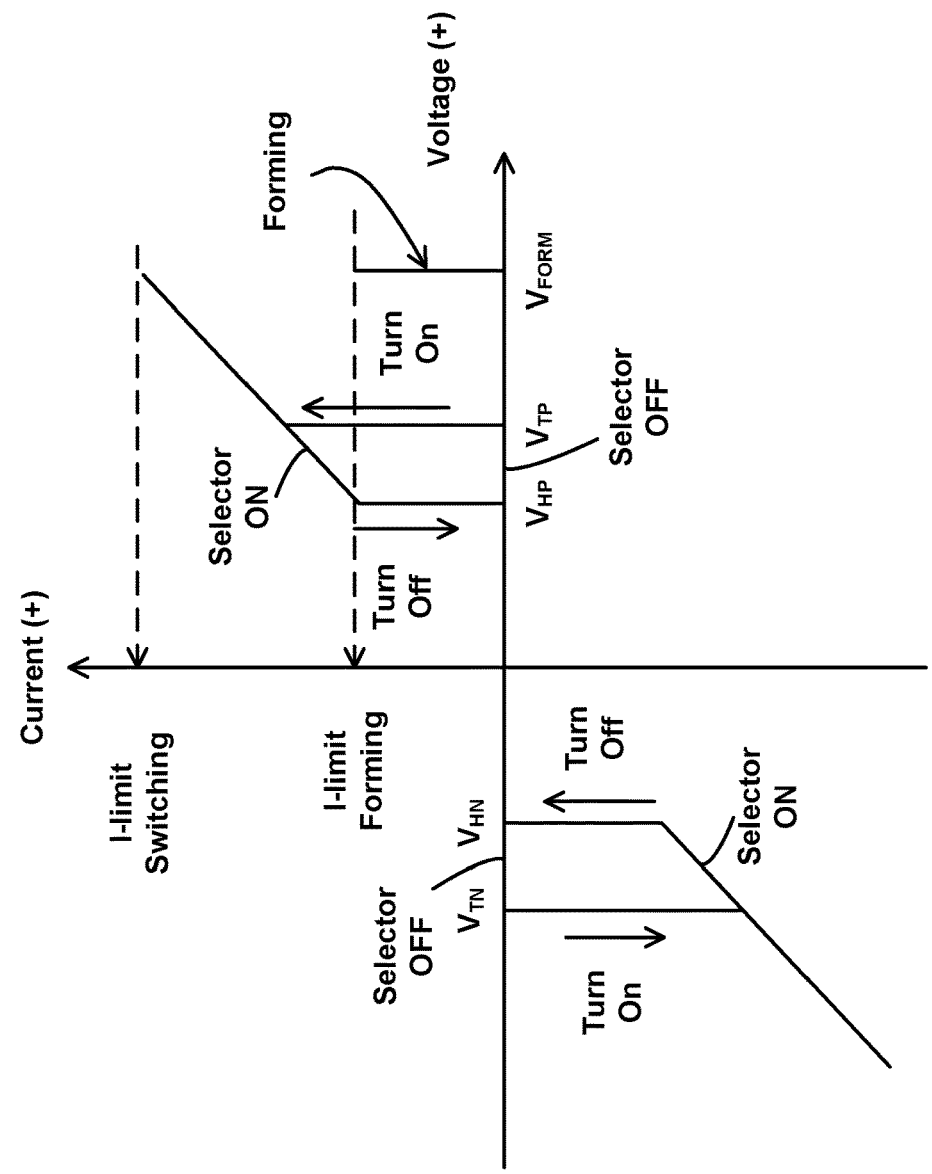
FIG. 2C depicts an example current-voltage characteristic of a threshold selector device of FIG. 2B.
Figure 2B:
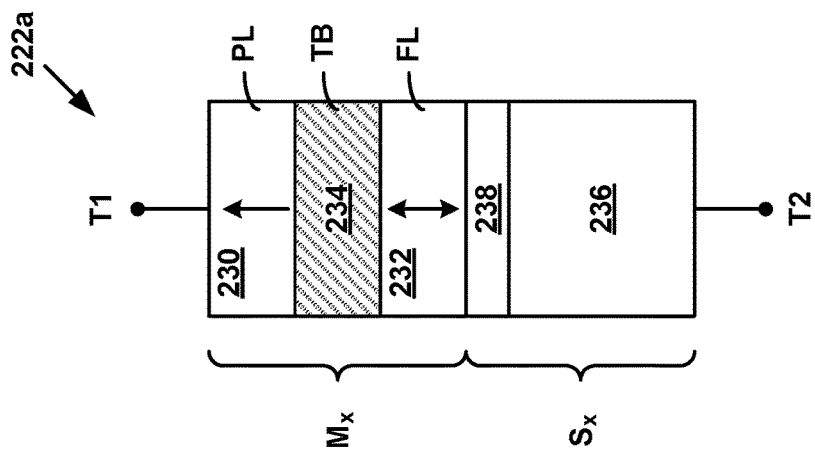
FIG. 2B depicts an embodiment of a memory cell of the three-dimensional memory array of FIG. 2A.

FIG. 2C is a diagram depicting example current-voltage (I-V) characteristics of a threshold selector device $S_x$. Each threshold selector device $S_x$ is initially in a high resistance (OFF) state. To operate threshold selector device $S_x$ as a threshold switch, an initial forming operation may be necessary so that threshold selector device $S_x$ operates in a current range in which switching can occur.

For example, a forming operation may include applying to threshold selector device $S_x$ one or more voltage pulses each having a magnitude greater than or equal to a forming voltage $V_{FORM}$. Following the forming operation, threshold selector device $S_x$ may be switched ON and OFF, and may be used as either a unipolar or a bipolar threshold selector device. Accordingly, threshold selector device $S_x$ may be referred to as a bipolar threshold selector device.

In the example I-V characteristics of FIG. 2C, for positive applied voltages, threshold selector device $S_x$ remains in a high resistance state (HRS) (e.g., OFF) until the voltage across the device meets or exceeds (i.e., is more positive than) a first threshold voltage, $V_{TP}$, at which point threshold selector device $S_x$ switches to a low resistance state (LRS) (e.g., ON). Threshold selector device $S_x$ remains turned ON until the voltage across the device drops to or below a first hold voltage, $V_{HP}$, at which point threshold selector device $S_x$ turns OFF.

For negative applied voltages, threshold selector device $S_x$ remains in a HRS (e.g., OFF) until the voltage across the device meets or exceeds (i.e., is more negative than) a second threshold voltage, $V_{TN}$, at which point threshold selector device $S_x$ switches to a LRS (e.g., ON). Threshold selector device $S_x$ remains turned ON until the voltage across the device increases to or exceeds (i.e., is less negative than) a second hold voltage, $V_{HN}$, at which point threshold selector device $S_x$ turns OFF.

Referring again to FIG. 2B, in an embodiment, magnetic memory element $M_x$ uses spin-transfer-torque (STT) switching. To "set" a bit value of magnetic memory element $M_x$ (i.e., choose the direction of the free layer magnetization), an electrical write current is applied from first terminal T1 to second terminal T2. The electrons in the write current become spin-polarized as they pass through pinned layer 230 because pinned layer 230 is a ferromagnetic metal.

A substantial majority of the conduction electrons in a ferromagnet will have a spin orientation that is parallel to the direction of magnetization, yielding a net spin polarized current. (Electron spin refers to angular momentum, which is directly proportional to but anti-parallel in direction to the magnetic moment of the electron, but this directional distinction will not be used going forward for ease of discussion.)

When the spin-polarized electrons tunnel across TB 234, conservation of angular momentum can result in the imparting of a torque on both free layer 232 and pinned layer 230, but this torque is inadequate (by design) to affect the direction of magnetization of pinned layer 230. Contrastingly, this torque is (by design) sufficient to switch the direction of magnetization of free layer 232 to become parallel to that of pinned layer 230 if the initial direction of magnetization of free layer 232 was anti-parallel to pinned layer 230. The parallel magnetizations will then remain stable before and after such write current is turned OFF.

In contrast, if free layer 232 and pinned layer 230 magnetizations are initially parallel, the direction of magnetization of free layer 232 can be STT-switched to become anti-parallel to that of pinned layer 230 by applying a write current of opposite direction to the aforementioned case. Thus, by way of the same STT physics, the direction of the magnetization of free-layer 232 can be deterministically set into either of two stable orientations by judicious choice of the write current direction (polarity).

In the example described above, spin-transfer-torque (STT) switching is used to "set" a bit value of magnetic memory element $M_x$. In other embodiments, field-induced switching, spin orbit torque (SOT) switching, VCMA (magnetoelectric) switching, or other switching techniques may be employed.

Figure 3A:
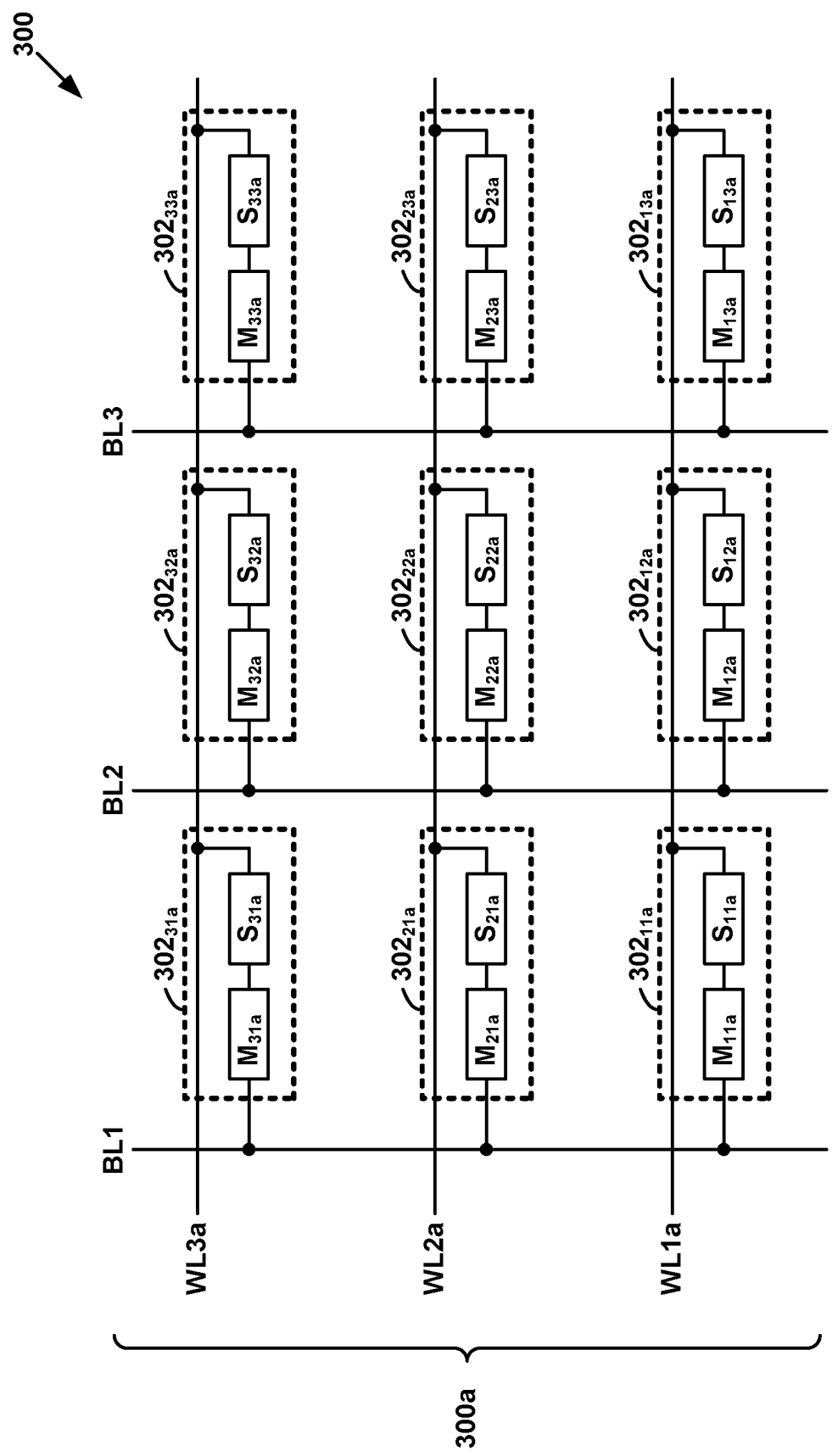
FIGS. 3A-3B depict an embodiment of a cross-point memory array.
Figure 3B:
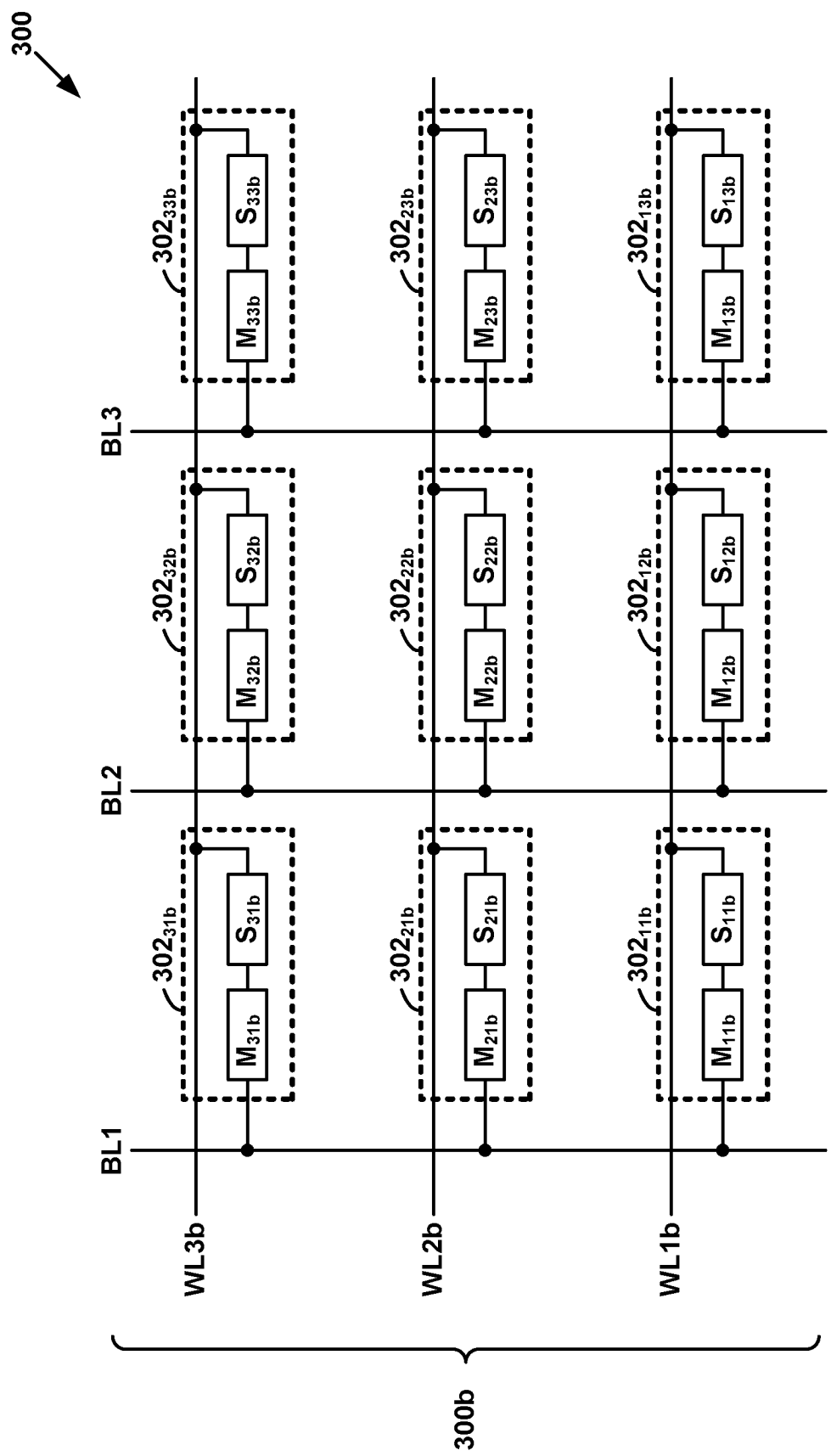

FIGS. 3A-3B are simplified schematic diagrams of an example cross-point memory array 300 which includes a first memory level 300a, and a second memory level 300b positioned above first memory level 300a. Cross-point memory array 300 is an example of an implementation of memory array 160 in FIG. 1E. Cross-point memory array 300 may include more than two memory levels.

Cross-point memory array 300 includes word lines WL1a, WL2a, WL3a, WL1b, WL2b, and WL3b, and bit lines BL1, BL2, and BL3. First memory level 300a includes memory cells $302_{11a}$, $302_{12a}$, ..., $302_{33a}$ coupled to word lines WL1a, WL2a, WL3a and bit lines BL1, BL2, and BL3, and second memory level 300b includes memory cells $302_{11b}$, $302_{12b}$, ..., $302_{33b}$ coupled to word lines WL1b, WL2b, WL3b and bit lines BL1, BL2, and BL3. In an embodiment, each of memory cells $302_{11a}$, $302_{12a}$, ..., $302_{33a}$ are vertically-oriented. In an embodiment, each of memory cells $302_{11b}$, $302_{12b}$, ..., $302_{33b}$ are vertically-oriented.

First memory level 300a is one example of an implementation for first memory level 212 of monolithic three-dimensional memory array 210 of FIG. 2A, and second memory level 300b is one example of an implementation for second memory level 214 of monolithic three-dimensional memory array 210 of FIG. 2A. In an embodiment, each of memory cells $302_{11}a$, $302_{12a}$, ..., $302_{33a}$, $302_{11b}$, $302_{12b}$, ..., $302_{33b}$, is an implementation of memory cell 222a of FIG. 2A.

Persons of ordinary skill in the art will understand that cross-point memory array 300 may include more or less than six word lines, more or less than three bit lines, and more or less than eighteen memory cells $302_{11a}$, $302_{12a}$, ..., $302_{33}a$, $302_{11}b$, $302_{12b}$, ..., $302_{33b}$. In some embodiments, cross-point memory array 300 may include 1000×1000 memory cells, although other array sizes may be used.

Each memory cell $302_{11a}$, $302_{12a}$, ..., $302_{33}a$, $302_{11}b$, $302_{12}b$, ..., $302_{33b}$ is coupled to one of the word lines and one of the bit lines, and includes a corresponding magnetic memory element $M_{11a}$, $M_{12a}$, ..., $M_{33a}$, $M_{11b}$, $M_{12b}$, ..., $M_{33b}$, respectively, coupled in series with a corresponding selector element $S_{11a}$, $S_{12a}$, ..., $S_{33a}$, $S_{11b}$, $S_{12b}$, ..., $S_{33b}$, respectively. In an embodiment, each of magnetic memory elements $M_{11a}$, $M_{12a}$, ..., $M_{33a}$, $M_{11b}$, $M_{12b}$, ..., $M_{33b}$ is an implementation of magnetic memory element $M_x$ of FIG. 2B, and each of selector elements $S_{11a}$, $S_{12a}$, ..., $S_{33a}$, $S_{11b}$, $S_{12b}$, ..., $S_{33b}$ is an implementation of selector element $S_x$ of FIG. 2B.

Each memory cell $302_{11a}$, $302_{12a}$, ..., $302_{33a}$ has a first terminal coupled to one of bit lines BL1, BL2, BL3, and a second terminal coupled to one of word lines WL1a, WL2a, WL3a, and each memory cell $302_{11b}$, $302_{12b}$, ..., $302_{33b}$ has a first terminal coupled to one of bit lines BL1, BL2, BL3, and a second terminal coupled to one of word lines WL1b, WL2b, WL3b. For example, memory cell $302_{13a}$ includes magnetic memory element $M_{13a}$ coupled in series with selector element $S_{13a}$, and includes a first terminal coupled to bit line BL3, and a second terminal coupled to word line WL1a.

Likewise, memory cell $302_{22b}$ includes magnetic memory element $M_{22b}$ coupled in series with selector element $S_{22b}$, and includes a first terminal coupled to bit line BL2, and a second terminal coupled to word line WL2b. Similarly, memory cell $302_{33a}$ includes magnetic memory element $M_{33a}$ coupled in series with selector element $S_{33a}$, and includes a first terminal coupled to bit line BL3, and a second terminal coupled to word line WL3a.

Magnetic memory elements $M_{11a}$, $M_{12a}$, ..., $M_{33a}$ may be disposed above or below corresponding selector elements $S_{11a}$, $S_{12a}$, ..., $S_{33a}$, respectively, and magnetic memory elements $M_{11b}$, $M_{12b}$, ..., $M_{33b}$, may be disposed above or below corresponding selector elements $S_{11b}$, $S_{12b}$, ..., $S_{33b}$, respectively.

In an embodiment, the orientation of memory cells $302_{11a}$, $302_{12a}$, ..., $302_{33a}$ of first memory level 300a is the same as the orientation of memory cell $302_{11b}$, $302_{12b}, \ldots, 302_{33b}$ of second memory level $300b$.

In another embodiment, the orientation of memory cells $302_{11a}, 302_{12a}, \ldots, 302_{33a}$ of first memory level $300a$ is opposite the orientation of memory cell $302_{11b}$, $302_{12b}, \ldots, 302_{33b}$ of second memory level $300b$.

Referring again to FIG. 1A, in an embodiment memory core 110 may include one or more two-dimensional arrays of memory cells and/or one or more three-dimensional arrays of memory cells. In an embodiment, memory core 110 may include re-writable memory cells, one-time programmable memory cells, and/or multi-time programmable memory cells, or any combination thereof.

Indeed, memory systems such as memory system 100 of FIG. 1A often may include one-time programmable memory for storing data related to operational parameters of the memory device, such as content management bits, trim bits, manufacturer data, format data, and other similar data. One technique for including such one-time programmable memory in memory system 100 is to include one-time programmable memory cells along with re-writable memory cells in memory core 110.

However, such previous techniques have often required different type of memory cell structures for one-time programmable memory cells and re-writable memory cells. Indeed, in some previous techniques fabrication of one-time programmable memory cells requires different materials and/or additional processing steps than the materials and/or processing steps used to fabricate re-writable memory cells. As a result, the need for different materials and/or additional processioning steps increased the cost, complexity and/or failure rate of previous techniques for providing one-time programmable memory cells and re-writable memory cells in memory core 110.

Technology is described for providing memory cells that may be used as either one-time programmable memory cells or re-writable memory cells. The memory cells have a same structure and are fabricated using a same fabrication process using same materials and same processing steps. The memory cells may be formed as a single memory array of memory cells, or may be formed as separate arrays of one-time programmable memory cells and re-writable memory cells.

Figure 4A:
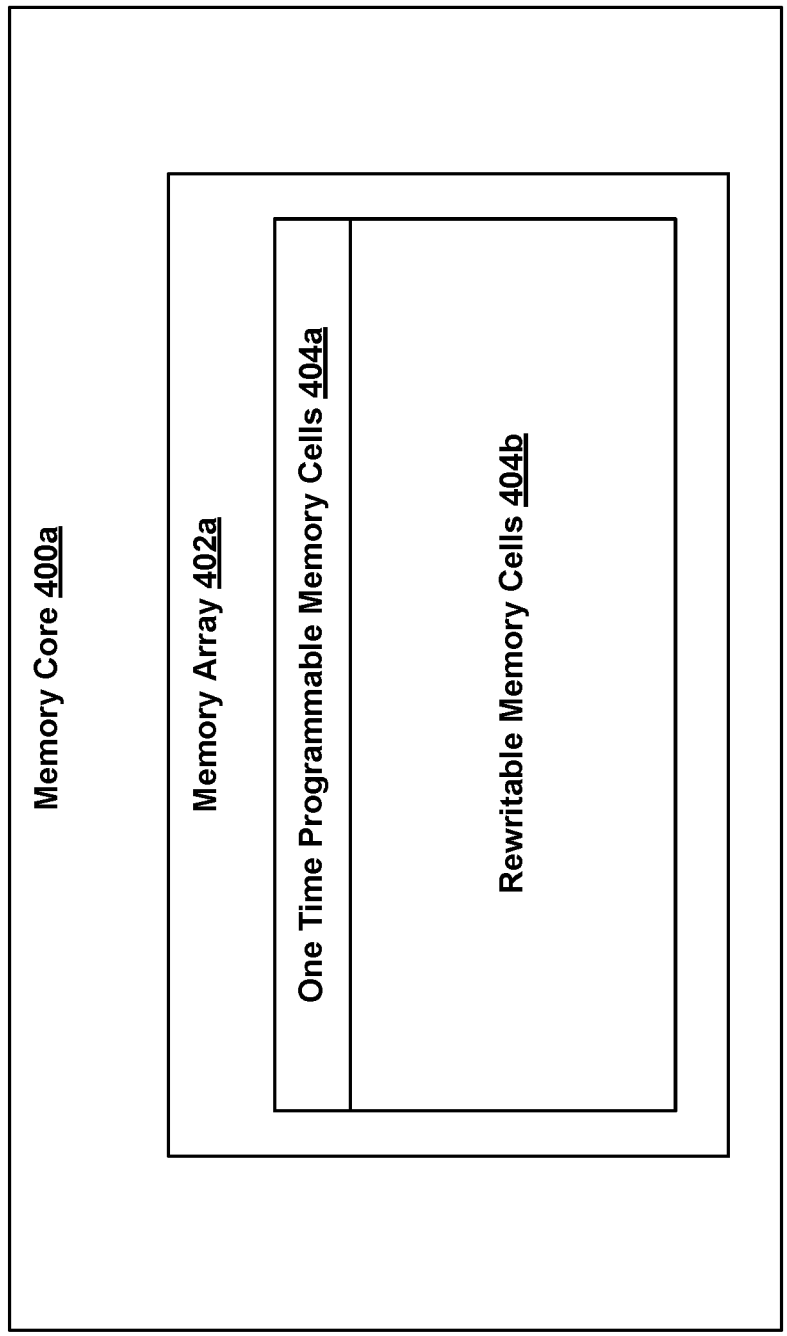
FIG. 4A is a simplified diagram of an embodiment of a memory core of FIG. 1A.

FIG. 4A is a simplified diagram of a memory core $400a$, which is an embodiment of memory core 110 of FIG. 1A. Memory core $400a$ includes one or more memory arrays, such as memory array $402a$. In an embodiment, memory array $402a$ includes a first array of one-time programmable memory cells $404a$ and a second array of re-writable memory cells $404b$. Persons of ordinary skill in the art will understand that memory array $402a$ alternatively may include more than one first array of one-time programmable memory cells $404a$ and more than one second array of re-writable memory cells $404b$.

Figure 4B:
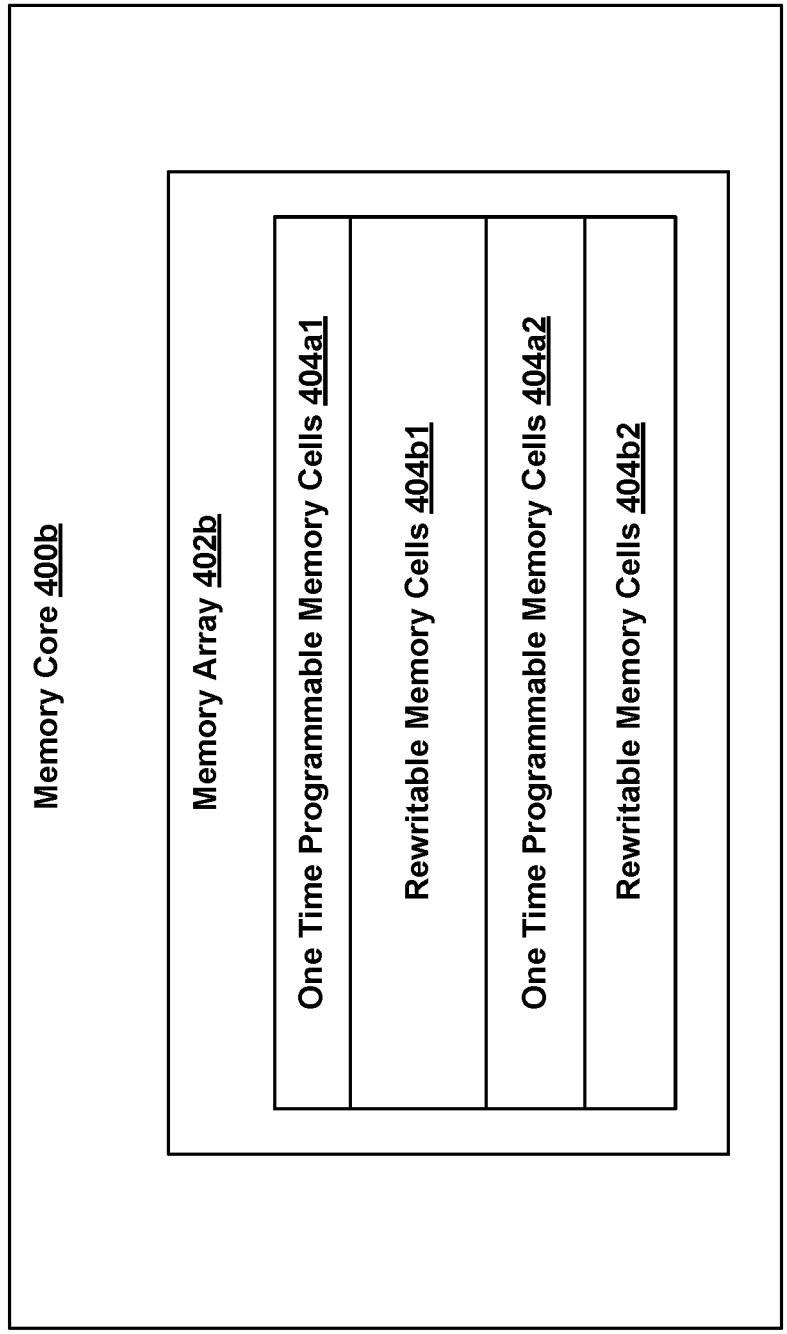
FIG. 4B is a simplified diagram of another embodiment of a memory core of FIG. 1A.

For example, FIG. 4B is a simplified diagram of a memory core $400b$, which is an embodiment of memory core 110 of FIG. 1A. Memory core $400b$ includes one or more memory arrays, such as memory array $402b$. In an embodiment, memory array $402b$ includes a first array of one-time programmable memory cells $404a$, including a first sub-array of one-time programmable memory cells $404a1$ and a second subarray of one-time programmable memory cells $404a2$, and a second array of re-writeable memory cells $404b$, which includes a first sub-array of re-writeable memory cells $404b1$ and a second sub-array of re-writeable memory cells $404b2$.

Referring again to FIG. 4A, in an embodiment first array of one-time programmable memory cells $404a$ may be used to store operational parameters of memory system 100 (FIG. 1A) or other data that are fixed and do not change over time. Persons of ordinary skill in the art will understand that other types of data may be stored in first array of one-time programmable memory cells $404a$.

In an embodiment, second array of re-writeable memory cells $404b$, in contrast, may be used to store user data that may be written, erased and re-written multiple times and that may change with time. Persons of ordinary skill in the art will understand that other types of data may be stored in second array of re-writeable memory cells $404b$.

In an embodiment, first array of one-time programmable memory cells $404a$ and second array of re-writeable memory cells $404b$ each comprise a same type of memory cell. In an embodiment, first array of one-time programmable memory cells $404a$ and second array of re-writeable memory cells $404b$ each include memory cells that include a threshold selector device (such as an ovonic threshold switch) coupled in series with a resistance-switching memory element (such as a magnetic memory element, a ReRAM memory element, a phase change memory element or other type of resistance-switching memory element).

For simplicity, the remaining text will describe memory cells that include an ovonic threshold switch coupled in series with a magnetic tunnel junction. For example, each memory cell in first array of one-time programmable memory cells $404a$ and second array of re-writeable memory cells $404b$ may be example memory cell $222a$ of FIG. 2B. Persons of ordinary skill in the art will understand that memory cells that include other types of threshold selector device and other types of memory element may be used.

In an embodiment, first array of one-time programmable memory cells $404a$ and second array of re-writeable memory cells $404b$ are portions of a single array of memory cells. For example, memory array 402 may include M rows of memory cells (e.g., rows $0, 1, 2, \ldots, M-1$). The first J rows of memory array $402a$ (e.g., rows $0, 1, 2, \ldots, J-1$) may constitute first array of one-time programmable memory cells $404a$, and the remaining (M-J) rows of memory array $402a$ (e.g., rows $J, J+1, \ldots, M-1$) may constitute second array of re-writeable memory cells $404b$.

In other embodiments, first array of one-time programmable memory cells $404a$ and second array of re-writeable memory cells $404b$ are separate memory arrays. In an embodiment, first array of one-time programmable memory cells $404a$ and second array of re-writeable memory cells $404b$ are fabricated using a same process (e.g., a same semiconductor fabrication process). In an embodiment, first array of one-time programmable memory cells $404a$ are fabricated using the same materials and the same manufacturing processing steps as second array of re-writeable memory cells $404b$.

In an embodiment, memory cells in first array of one-time programmable memory cells $404a$ and memory cells in second array of re-writeable memory cells $404b$ have a same structure. In an embodiment, first array of one-time programmable memory cells $404a$ and second array of re-writeable memory cells $404b$ each include cross-point memory arrays, and each memory cell in the cross-point memory arrays includes a threshold selector device (such as an ovonic threshold switch) coupled in series with a magnetic memory element (such as a magnetic tunnel junction).

As described above, in an embodiment each memory cell in first array of one-time programmable memory cells $404a$ and second array of re-writeable memory cells 404b is example memory cell 222a of FIG. 2B. In particular, in an embodiment each memory cell in first array of one-time programmable memory cells 404a and second array of re-writeable memory cells 404b includes a magnetic tunnel junction memory element $M_x$ coupled in series with an ovonic threshold switch $S_x$.

To avoid confusion, memory cells in first array of one-time programmable memory cells 404a will be referred to in the remaining description as one-time programmable memory cells 222o, and memory cells in second array of re-writeable memory cells 404b will be referred to in the remaining description as re-writeable memory cells 222r. Persons of ordinary skill in the art will understand that in an embodiment each one-time programmable memory cell 222o and each re-writeable memory cell 222r is an instance of example memory cell 222a of FIG. 2B.

In an embodiment, each re-writeable memory cell 222r in second array of re-writeable memory cells 404b undergoes a forming operation so that ovonic threshold switch $S_x$ can be selectively switched ON and OFF. Following the forming operation, the magnetic tunnel junction memory element $M_x$ of each re-writeable memory cell 222r in second array of re-writeable memory cells 404b may be used to store the data state of the memory cell, and each re-writeable memory cell 222r in second array of re-writeable memory cells 404b is re-writeable.

In an embodiment, each one-time programmable memory cell 222o in first array of one-time programmable memory cells 404a is either in a first state (also referred to herein as a "virgin state" or an "unprogrammed state") or a second state (also referred to herein as a "cycled state" or a "programmed state"). In an embodiment, each one-time programmable memory cell 222o in first array of one-time programmable memory cells 404a is in an unprogrammed state as fabricated and before any forming operation is used on the one-time programmable memory cell 222o.

In an embodiment, a one-time programmable memory cell 222o in first array of one-time programmable memory cells 404a is in a programmed state after undergoing a forming operation. For example, a one-time programmable memory cell 222o in first array of one-time programmable memory cells 404a is in a programmed state after one or more voltage pulses each having a magnitude greater than or equal to forming voltage $V_{FORM}$ is applied to the threshold selector device $S_x$ of the one-time programmable memory cell 222o.

In an embodiment, for a one-time programmable memory cell 222o in the unprogrammed state the ovonic threshold switch $S_x$ of one-time programmable memory cell 222o has a first resistance. For example, the first resistance of the ovonic threshold switch $S_x$ may be on the order of hundreds of mega-ohms, or some other relatively high resistance.

In an embodiment, the magnetic tunnel junction memory element $M_x$ may have either a second resistance (e.g., resistance RP) or a third (e.g., resistance RAP). In an embodiment, second resistance RP and third resistance RAP of the magnetic tunnel junction memory element $M_x$ may be on the order of tens of kilo-ohms, or some other relatively low resistance.

Thus, in an embodiment for one-time programmable memory cells 222o in the unprogrammed state the effect of the resistance of the magnetic tunnel junction memory element $M_x$ is negligible. In other words, regardless of whether the magnetic tunnel junction memory element $M_x$ has second resistance RP or third resistance RAP (or is even electrically shorted), for one-time programmable memory cells 222o in the unprogrammed state the first resistance of the ovonic threshold switch $S_x$ is dominant. Thus, in an embodiment one-time programmable memory cells 222o in the unprogrammed state have a first state resistance that is substantially equal to the first resistance of the ovonic threshold switch $S_x$.

In an embodiment, for one-time programmable memory cells 222o in the programmed state the ovonic threshold switch $S_x$ of has a fourth resistance that is much lower than second resistance RP and third resistance RAP of the magnetic tunnel junction memory element $M_x$. In other words, for one-time programmable memory cells 222o in the programmed state the resistance of the magnetic tunnel junction memory element $M_x$ is dominant. Thus, in an embodiment one-time programmable memory cells 222o in the programmed state have a second state resistance that is substantially equal to the resistance of the magnetic tunnel junction memory element $M_x$. In an embodiment, the second state resistance is much less than the first state resistance.

Thus, in an embodiment each one-time programmable memory cell 222o in first array of one-time programmable memory cells 404a is either in an unprogrammed state and has a first state resistance, or a programmed state and has a second state resistance. In an embodiment, the first state resistance (e.g., on the order of hundreds of mega-ohms) is much greater than the second state resistance (e.g., on the order of tens of kilo-ohms). In an embodiment, the first state resistance is substantially equal to the first resistance of the ovonic threshold switch $S_x$. In an embodiment, the first state resistance is substantially equal to the resistance of the magnetic tunnel junction memory element $M_x$.

Figure 5:
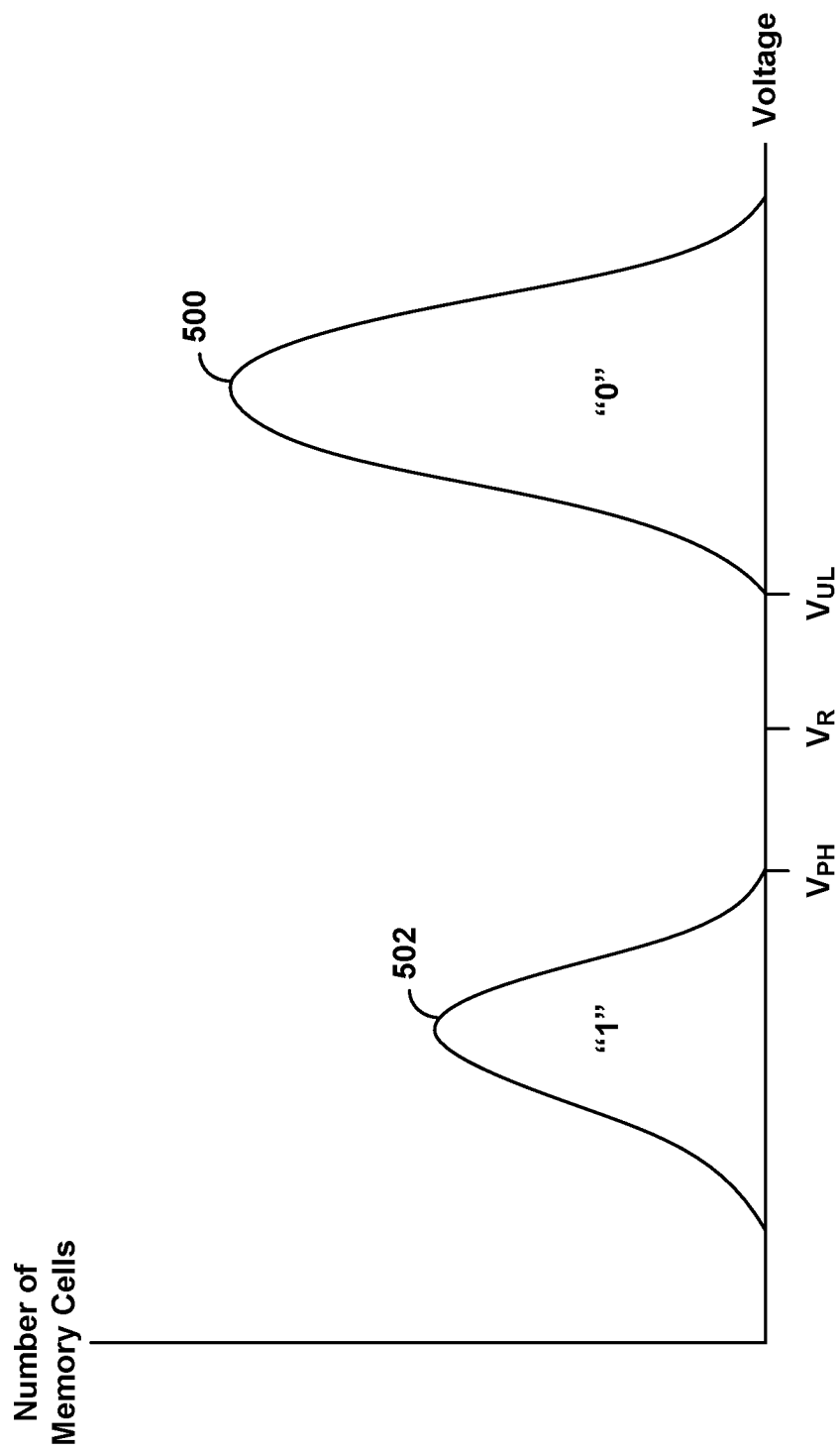
FIG. 5 depicts an embodiment of threshold voltage distributions for a one-time programmable memory cells in which each memory cell stores binary data.

FIG. 5 depicts an embodiment of threshold voltage distributions for a one-time programmable memory cells 222o described above. Unprogrammed one-time programmable memory cells 222o have a first threshold voltage distribution 500, and programmed one-time programmable memory cells 222o have a second threshold voltage distribution 502. In an embodiment, first threshold voltage distribution 500 may be used to represent a first data state (e.g., a "0" or "low resistance" data state), and second threshold voltage distribution 502 may be used to represent a second data state (e.g., a "1" or "high resistance" data state).

In an embodiment, first threshold voltage distribution 500 has a lower limit $V_{UL}$, and second voltage distribution 502 has an upper limit $V_{PH}$. For example, by a selection of materials of the ovonic threshold switch $S_x$, lower limit $V_{UL}$ may be about 4V. In addition, by performing one or more forming steps, upper limit $V_{PH}$ may be about 2V. Persons of ordinary skill in the art will understand that lower limit $V_{UL}$ and upper limit $V_{PH}$ may have values other than these example values.

In the example threshold voltage distributions of FIG. 5, a read voltage $V_R$ is shown that is less than lower limit $V_{UL}$ and is greater than upper limit $V_{PH}$. For example, read voltage $V_R$ may be about 3V, although other values may be used. Thus, read voltage $V_R$ may be used to determine the data state of one-time programmable memory cells 222o.

For example, if read voltage $V_R$ is applied to an unprogrammed one-time programmable memory cell 222o, the memory cell will have a relatively high resistance (e.g., the first state resistance) and a relatively low current (a "first current"). Accordingly, such a memory cell is interpreted as having a "0" or "high resistance" data state.

Conversely, if read voltage $V_R$ is applied to a programmed one-time programmable memory cell 222o, the memory cell will have a relatively low resistance (e.g., the second state resistance) and a relatively high current (a "second current").

Accordingly, such a memory cell is interpreted as having a "1" or "low resistance" data state.

In an embodiment a programming operation is only performed on one-time programmable memory cells 222o that are to be in a "1" or "low resistance" data state. For example, as described above, a programming operation includes applying one or more forming voltage pulses each having a magnitude greater than or equal to forming voltage $V_{FORM}$ to the threshold selector device $S_x$ of the one-time programmable memory cell 222o. Fore one-time programmable memory cell 222o that are to be in a "0" or "high resistance" data state, no programming operation is performed and such cells remain in the virgin state or unprogrammed state.

Without wanting to be bound by any particular theory it is believed that for one-time programmable memory cell 222o described above, the resistance state of the magnetic tunnel junction memory element $M_x$ is immaterial and has substantially no impact on the operation of one-time programmable memory cell 222o described above.

In addition, without wanting to be bound by any particular theory it is believed that whether the magnetic tunnel junction memory element $M_x$ is in the 0 state, the 1 state, or is a shorted (defective) device has no impact on the operation of one-time programmable memory cell 222o described above.

Indeed, without wanting to be bound by any particular theory it is believed that one-time programmable memory cells 222o are very resilient with respect to the process used to form magnetic tunnel junction memory elements $M_x$.

Without wanting to be bound by any particular theory it is believed that one-time programmable memory cells 222o will function regardless of whether the magnetic tunnel junction memory elements $M_x$ are able to turn ON and OFF, and even if the magnetic tunnel junction memory elements $M_x$ is shorted.

Without wanting to be bound by any particular theory, it is believed that the reliability of one-time programmable memory cell 222o described above is not affected by any defects in the magnetic tunnel junction memory element $M_x$ or any state changes in the magnetic tunnel junction memory element $M_x$.

Without wanting to be bound by any particular theory, it is believed that providing a wide gap between lower limit $V_{UL}$ and upper limit $V_{PH}$ will facilitate distinguishing between programmed and unprogrammed one-time programmable memory cells.

Without wanting to be bound by any particular theory, it is believed that a single semiconductor fabrication process can be used to form a cross-point array of memory cells, where each memory cell includes an ovonic threshold switch in series with a magnetic tunnel junction memory element, and that a first portion of memory cells in the cross-point array may be used as one-time programmable memory cells, and a second portion of memory cells in the cross-point array may be used as re-writeable memory cells.

One embodiment of the disclosed technology includes a memory cell having a reversible resistance-switching memory element coupled in series with a selector element. The selector element has a first resistance. The resistance-switching memory element is configured to reversibly switch between a second resistance and a third resistance. The memory cell may be selectively configured as either a re-writeable memory cell or a one-time programmable memory cell. The memory cell functions as a one-time programmable memory cell regardless of whether the resistance-switching memory element has the second resistance, the third resistance, or is electrically shorted.

One embodiment of the disclosed technology includes an apparatus that includes a cross-point memory array having a plurality of memory cells. Each memory cell includes a magnetic tunnel junction memory element coupled in series with a selector element. Each memory cell in the cross-point memory array may be selectively configured as either a re-writeable memory cell or a one-time programmable memory cell.

One embodiment of the disclosed technology includes a method that includes forming first memory cells and second memory cells using a same fabrication process, and storing data having a first data state and a second data state in the first memory cells. Each first memory cell and each second memory cell has a same structure that includes a magnetic tunnel junction memory element coupled in series with an ovonic threshold switch. The first memory cells are one-time programmable memory cells and the second memory cells are re-writeable memory cells. Data are stored in the first memory cells by using in a virgin state each first memory cell having the first data state, and applying one or more forming voltage pulses to each first memory cell designated having the second data state.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus comprising:
a memory cell comprising a reversible resistance-switching memory element coupled in series with a selector element, wherein:
the selector element comprises a first resistance;
the reversible resistance-switching memory element is configured to reversibly switch between a second resistance and a third resistance;
the memory cell may be selectively configured as either a re-writeable memory cell or a one-time programmable memory cell; and
the memory cell functions as a one-time programmable memory cell regardless of whether the resistance-switching memory element has the second resistance, the third resistance, or is electrically shorted.

2. The apparatus of claim 1, wherein the first resistance is a resistance of the selector element as fabricated.

3. The apparatus of claim 1, wherein:
the selector element is configured to irreversibly switch from the first resistance and a fourth resistance;
the first resistance is higher than the second resistance and the third resistance; and
the first resistance is higher than the fourth resistance.

4. The apparatus of claim 1, wherein the selector element is configured to irreversibly switch from the first resistance to a fourth resistance in response to a forming operation performed on the selector element.

5. The apparatus of claim 1, wherein the selector element is configured to irreversibly switch from the first resistance to a fourth resistance in response to one or more forming voltage pulses being applied to the selector element.

6. The apparatus of claim 1, wherein:
the memory cell is configured as a one-time programmable memory cell that may have a first state resistance or a second state resistance; and
the first state resistance substantially equals the first resistance.

7. The apparatus of claim 1, wherein:
the memory cell is configured as a one-time programmable memory cell that may have a first state resistance or a second state resistance; and
the second state resistance is larger than the second or the third resistance.

8. The apparatus of claim 1, wherein the reversible resistance-switching memory element comprises a magnetic memory element.

9. The apparatus of claim 1, wherein the reversible resistance-switching memory element comprises a magnetic tunnel junction memory element.

10. The apparatus of claim 1, wherein the selector element comprises an ovonic threshold switch.

11. An apparatus comprising:
a cross-point memory array comprising a plurality of memory cells, each memory cell comprising a magnetic tunnel junction memory element coupled in series with a selector element, wherein each selector element comprises a first resistance and each magnetic tunnel junction memory element is configured to reversibly switch between a second resistance and a third resistance;
wherein each memory cell in the cross-point memory array may be selectively configured as either a re-writeable memory cell or a one-time programmable memory cell,
wherein each memory cell configured as a one-time programmable memory cell functions regardless of whether the magnetic tunnel junction memory element has the second resistance, the third resistance, or is electrically shorted.

12. The apparatus of claim 11, wherein the selector element comprises an ovonic threshold switch.

13. The apparatus of claim 11, wherein the first resistance is a resistance of the corresponding selector element as fabricated.

14. The apparatus of claim 11, wherein:
each selector element is configured to irreversibly switch from a first resistance and a fourth resistance;
the first resistance is higher than the second resistance and the third resistance; and
the fourth resistance is lower than the second resistance and the third resistance.

15. The apparatus of claim 11, wherein the selector element is configured to irreversibly switch from the first resistance to a fourth resistance in response to a forming operation performed on the selector element.

16. The apparatus of claim 11, wherein the selector element is configured to irreversibly switch from the first resistance to a fourth resistance in response to one or more forming voltage pulses being applied to the selector element.

17. A method comprising:
forming first memory cells and second memory cells using a same fabrication process, each first memory cell and each second memory cell comprising a same structure comprising a magnetic tunnel junction memory element coupled in series with an ovonic threshold switch; and
storing data having a first data state and a second data state in the first memory cells by:
using in a virgin state each first memory cell having the first data state; and
applying one or more forming voltage pulses to each first memory cell designated having the second data state,
wherein the first memory cells comprise one-time programmable memory cells and the second memory cells comprise re-writeable memory cells.

18. The method of claim 17, wherein each first memory cell comprises a threshold voltage, wherein first memory cells that have the first data state have a higher threshold voltage than first memory cells that have the second data state.

19. The method of claim 17, wherein the first memory cells and the second memory cells comprise a cross-point memory array.

* * * * *